United States Patent
Fukasawa

(10) Patent No.: US 9,882,106 B2
(45) Date of Patent: Jan. 30, 2018

(54) SEMICONDUCTOR DEVICE AND LIGHT-EMITTING APPARATUS

(71) Applicants: CITIZEN ELECTRONICS CO., LTD., Fujiyoshida-shi, Yamanashi (JP); CITIZEN HOLDINGS CO., LTD., Tokyo (JP)

(72) Inventor: Koichi Fukasawa, Kofu (JP)

(73) Assignees: CITIZEN ELECTRONICS CO., LTD., Yamanashi (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 15/222,383

(22) Filed: Jul. 28, 2016

(65) Prior Publication Data

US 2017/0133567 A1    May 11, 2017

(30) Foreign Application Priority Data

Jul. 30, 2015   (JP) ................................ 2015-150877

(51) Int. Cl.
| | |
|---|---|
| H01L 33/00 | (2010.01) |
| H01L 33/62 | (2010.01) |
| H01L 33/50 | (2010.01) |
| H01L 33/38 | (2010.01) |
| H01L 33/56 | (2010.01) |

(52) U.S. Cl.
CPC .............. *H01L 33/62* (2013.01); *H01L 33/38* (2013.01); *H01L 33/507* (2013.01); *H01L 33/56* (2013.01); *H01L 2933/005* (2013.01); *H01L 2933/0041* (2013.01); *H01L 2933/0066* (2013.01)

(58) Field of Classification Search
CPC ....... H01L 33/62; H01L 33/507; H01L 33/38; H01L 2933/005; H01L 2933/0041; H01L 33/56; H01L 2933/0066
See application file for complete search history.

(56) References Cited

U.S. PATENT DOCUMENTS

| | | | |
|---|---|---|---|
| 9,548,282 B2 * | 1/2017 | Lin | ......................... H01L 24/13 |
| 2002/0011677 A1 * | 1/2002 | Yokoi | ...................... H01L 24/11 |
| | | | 257/782 |

(Continued)

FOREIGN PATENT DOCUMENTS

| | | |
|---|---|---|
| JP | 2003124378 | 4/2003 |
| JP | 2008021751 | 1/2008 |

*Primary Examiner* — Victor A Mandala
(74) *Attorney, Agent, or Firm* — RatnerPrestia

(57) ABSTRACT

A semiconductor device wherein the horizontal spreading of solder at the time of reflow is suppressed and a plurality of devices can be mounted close to each other on a substrate, and a light-emitting apparatus using such a semiconductor device as a light-emitting device are provided. A semiconductor device bonded to a substrate by solder includes a semiconductor layer, a plurality of device electrodes formed on a bottom surface of the semiconductor layer, and a plurality of auxiliary electrodes formed integrally with the device electrodes, respectively, wherein each of the auxiliary electrodes includes a groove portion formed in a bottom surface thereof, and a side face of the groove portion is slanted with respect to the bottom surface of the semiconductor layer so that the groove portion becomes narrower in width with increasing distance from a lower end of the auxiliary electrode and decreasing distance to an upper end thereof.

8 Claims, 9 Drawing Sheets

(56) References Cited

U.S. PATENT DOCUMENTS

| | | | | |
|---|---|---|---|---|
| 2005/0282411 | A1* | 12/2005 | Fork | G01R 1/0466 439/74 |
| 2007/0290343 | A1* | 12/2007 | Harada | H01L 24/03 257/737 |
| 2008/0135283 | A1* | 6/2008 | Hibino | H01L 21/4853 174/260 |
| 2015/0115440 | A1* | 4/2015 | Higuchi | H01L 24/05 257/737 |
| 2015/0235984 | A1* | 8/2015 | Aoyagi | H01L 24/81 438/107 |
| 2015/0287688 | A1* | 10/2015 | Lin | H01L 24/81 257/738 |
| 2016/0300988 | A1* | 10/2016 | Oh | H01L 33/60 |
| 2016/0307861 | A1* | 10/2016 | Lin | H01L 28/00 |

* cited by examiner

SEMICONDUCTOR DEVICE AND LIGHT-EMITTING APPARATUS

CROSS REFERENCE TO RELATED APPLICATION

This application is a new U.S. patent application that claims benefit of JP2015-150877, filed on Jul. 30, 2015. The entire contents of JP2015-150877 are hereby incorporated by reference.

TECHNICAL FIELD

The present invention relates to a semiconductor device and a light-emitting apparatus.

BACKGROUND

Semiconductor chip mounting methods are known in the art which connect semiconductor chips to substrate electrodes via protruding bump electrodes formed, for example, by gold or solder plating. Japanese Unexamined Patent Publication No. 2008-021751, for example, discloses an electrode connecting structure for a semiconductor chip wherein protruding electrodes are formed on the semiconductor chip side and electrodes each having an insertion opening are formed on the substrate side, and wherein the electrodes of the semiconductor chip are inserted in the insertion openings of the corresponding substrate electrodes by being slidingly guided along the opening edges of the insertion openings of the respective substrate electrodes so that the electrodes of the semiconductor chip are each centered in the corresponding substrate electrode for connection. The invention disclosed in this patent document claims that, with this connecting structure, any positional displacement that may occur between the electrodes is corrected during bonding.

On the other hand, Japanese Unexamined Patent Publication No. 2003-124378 discloses a chip component in which a device chip is mounted on the upper surface of a substrate and two electrodes connected to the device chip are disposed at opposite ends of the lower surface of the substrate, wherein at least one crest or trough is formed on the opposing ends of the two electrodes. According to this chip component, even when the component is mounted sideways, squeezing out or drooping of a solder paste can be suppressed, preventing the solder paste from building up in the lower part of the bonding portion. As a result, occurrence of a short circuit between the two electrodes and formation of solder side balls can be prevented.

SUMMARY

In recent years, with ever shrinking semiconductor device size, semiconductor devices have come to be mounted at high density on a substrate. However, when the electrode spacing of such semiconductor devices is reduced, the solder used to mount the semiconductor device may flow into the space between the electrodes, resulting in a short circuit.

FIGS. 9A to 9C are cross-sectional views for explaining a mounting process for a semiconductor device having soldering electrodes 80 according to the prior art. The semiconductor device shown here is a bump-type device on the bottom surface of which the soldering electrodes 80 are formed; in FIGS. 9A to 9C, a substrate 81 on which the semiconductor device is mounted, electrically conductive patterns 82 formed on the substrate 81, and solder 83 for bonding are shown along with the soldering electrodes 80. FIGS. 9A to 9C show the condition before mounting the semiconductor device, the condition after mounting, and the condition after solder reflow, respectively.

When the semiconductor device is mounted on the substrate 81, the lower ends of the soldering electrodes 80 shown in FIG. 9A contact the solder 83 applied on the electrically conductive patterns 82 formed on the substrate 81, as shown in FIG. 9B. When solder reflow is performed in this condition, the solder 83 melts and spreads horizontally while also spreading up the side faces of the soldering electrodes 80, as shown in FIG. 9C. As the solder 83 thus spreads horizontally, the solder 83 may contact each other between the adjacent soldering electrodes 80 in some locations and may thus result in a short circuit. As a result, in the case of semiconductor devices having such soldering electrodes 80, the devices must be spaced apart from each other by a certain distance, and it is difficult to mount them close to each other. Furthermore, since the spacing between the plurality of electrodes provided on each individual semiconductor device is also small, the device electrodes must also be spaced apart from each other by a certain distance in order to prevent a short circuit from occurring between the soldering electrodes connected to the respective device electrodes.

Accordingly, it is an object of the present invention to provide a semiconductor device wherein the horizontal spreading of solder at the time of reflow is suppressed, thereby making it possible to mount a plurality of devices close to each other on a substrate; it is also an object of the invention to provide a light-emitting apparatus that uses such a semiconductor device as a light-emitting device.

Provided is a semiconductor device which is bonded to a substrate by solder, including a semiconductor layer, a plurality of device electrodes formed on a bottom surface of the semiconductor layer, and a plurality of auxiliary electrodes formed integrally with the plurality of device electrodes, respectively, wherein each of the auxiliary electrodes includes a groove portion formed in a bottom surface thereof, and a side face of the groove portion is slanted with respect to the bottom surface of the semiconductor layer so that the groove portion becomes narrower in width with increasing distance from a lower end of the auxiliary electrode and decreasing distance to an upper end thereof.

Preferably, in the above semiconductor device, in each auxiliary electrode having a plurality of side faces, the groove portion is formed passing through a side face of the auxiliary electrode that does not face any other auxiliary electrode.

Preferably, in the above semiconductor device, in each of the auxiliary electrodes, a side face through which the groove portion is not formed is perpendicular to the bottom surface of the semiconductor layer.

Preferably, in the above semiconductor device, the semiconductor layer contains a light-emitting layer, and the semiconductor device further includes a phosphor layer which contains a phosphor and which covers a top surface and side surface of the semiconductor layer.

Preferably, in the above semiconductor device, horizontal end portions of the plurality of auxiliary electrodes are located inwardly of an outer peripheral surface of the phosphor layer.

Further, provided is a light-emitting apparatus including a semiconductor light-emitting device, and a substrate formed with an electrically conductive pattern thereon to which the semiconductor light-emitting device is bonded by solder, wherein the semiconductor light-emitting device includes a semiconductor layer containing a light-emitting layer, a plurality of device electrodes formed on a bottom surface of the semiconductor layer, and a plurality of auxiliary electrodes formed integrally with the plurality of device electrodes, respectively, and wherein each of the auxiliary electrodes includes a groove portion formed in a bottom surface thereof, and a side face of the groove portion is slanted with respect to the bottom surface of the semiconductor layer so that the groove portion becomes narrower in width with increasing distance from a lower end of the auxiliary electrode and decreasing distance to an upper end thereof.

According to the above semiconductor device and light-emitting apparatus, the horizontal spreading of solder at the time of reflow is suppressed, and thus it is possible to mount a plurality of devices close to each other on a substrate.

BRIEF DESCRIPTION OF THE DRAWINGS

Other features and advantages of the present invention will be apparent from the ensuing description, taken in conjunction with the accompanying drawings, in which:

FIGS. 9A to 20 are cross-sectional views for explaining a mounting process for a semiconductor device having soldering electrodes 80 according to the prior art.

DESCRIPTION

Hereinafter, with reference to the accompanying drawings, a semiconductor device and a light-emitting apparatus will be explained in detail. However, it should be noted that the present invention is not limited to the drawings or the embodiments described below.

The following description is given by taking as an example the case where the semiconductor device is a two-terminal device, or more specifically, an LED (light-emitting diode) device. However, the semiconductor device described in this specification is not limited to an LED or a two-terminal device, but may be some other device such as an IC.

Figure 1A:
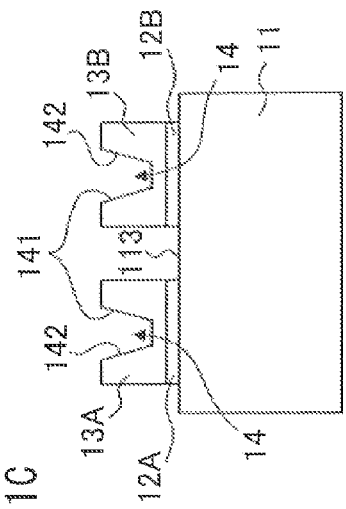
FIGS. 1A to 1D are diagrams showing the physical geometry of an LED device 1.
Figure 1B:
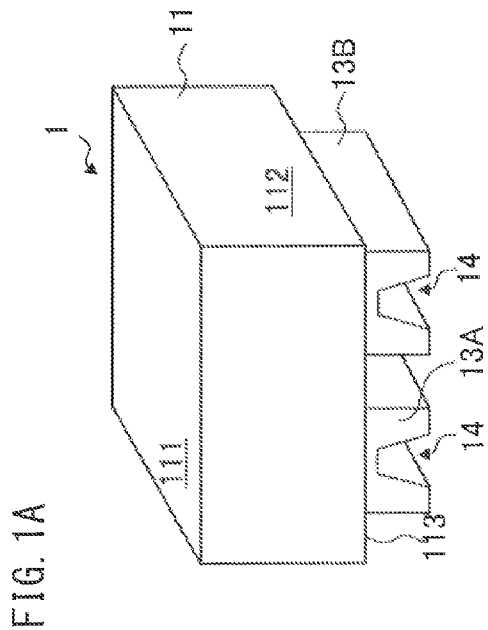
Figure 1C:
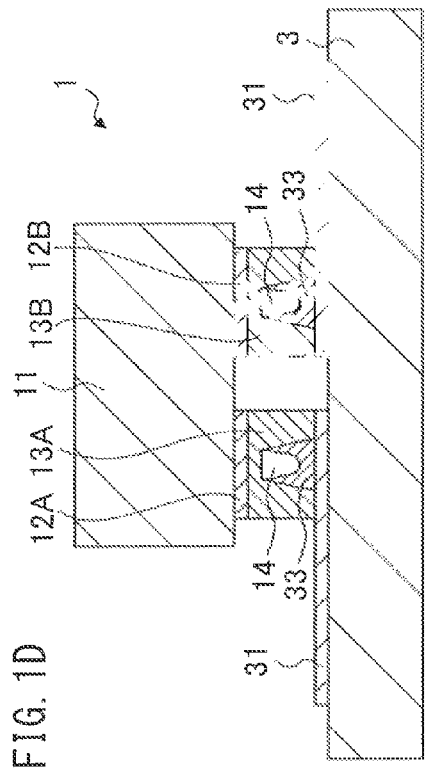
Figure 1D:
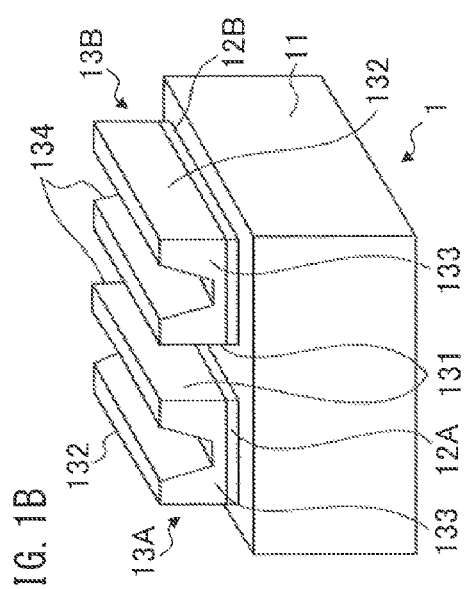
Figure 2:
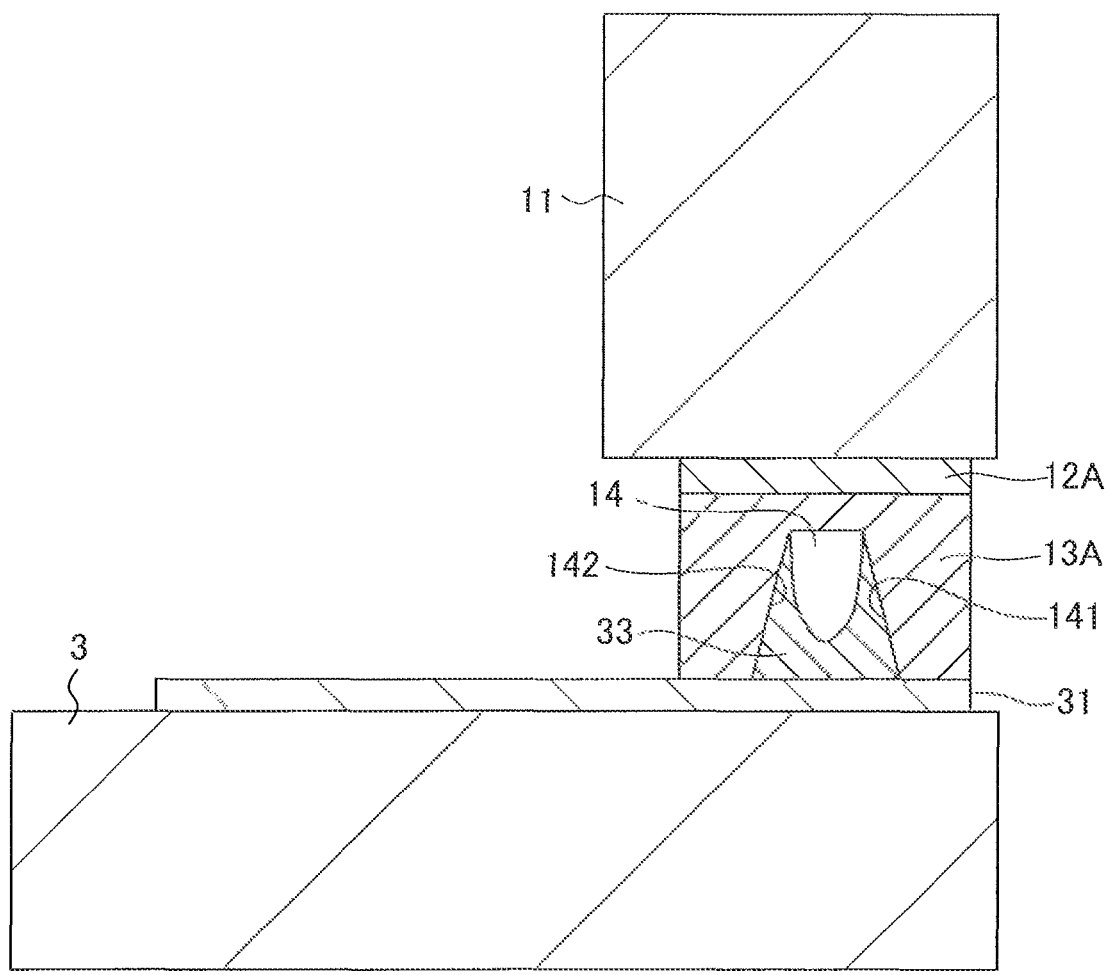
FIG. 2 is an enlarged view showing a portion of FIG. 1D.

FIGS. 1A to 1D are diagrams showing the physical geometry of an LED device 1. FIGS. 1A to 1D are, respectively, a perspective view of the LED device 1, a perspective view showing the LED device 1 with its bottom surface 113 facing up (i.e., upside down), a side view of the LED device 1 turned upside down as in FIG. 1B, and a cross-sectional view of the LED device 1 bonded to a substrate 3 via solder 33. FIG. 2 is an enlarged view showing a portion of FIG. 1D.

The LED device 1 includes a semiconductor layer 11, device electrodes 12A and 12B, and auxiliary electrodes 13A and 13B. The LED device 1 is a bump-type semiconductor device in which the auxiliary electrodes 13A and 13B as bumps for flip-chip bonding are formed on the device electrodes 12A and 12B provided on the bottom surface 113 of the semiconductor layer 11. As shown in FIG. 1D, the LED device 1 is bonded by the solder 33 onto electrically conductive patterns 31 formed on the insulating substrate 3 such as a glass epoxy substrate. The LED device 1 is a tiny device measuring, for example, several hundred microns square; though not shown in FIG. 1D, a plurality of such devices are mounted close together on the substrate 3 (see FIG. 7 to be presented later).

The semiconductor layer 11 is constructed by forming a plurality of semiconductor layers, such as an n-type semiconductor layer and a p-type semiconductor layer, one on top of another, and contains therein a light-emitting layer. The LED device 1 is, for example, a blue-emitting semiconductor light-emitting device (blue LED), and emits blue light with an emission wavelength range of about 450 to 460 nm. The semiconductor layer 11 of the LED device 1 shown here is formed in the shape of a rectangular parallelepiped (box-like shape), but the semiconductor layer 11 may be formed in any other suitable shape such as a cylindrical shape or an octagonal prism shape.

The device electrodes 12A and 12B are electrodes that function as a positive electrode and a negative electrode, respectively, for causing the light-emitting layer contained in the semiconductor layer 11 to emit light, and are formed on the bottom surface 113 of the semiconductor layer 11. As shown in FIGS. 1A and 1B, the device electrodes 12A and 12B are disposed symmetrically about a center line bisecting the bottom surface 113, and each device electrode has a plate-like shape extending along the center line.

The auxiliary electrodes 13A and 13B are electrodes that function as soldering electrodes when bonding the LED device 1 to the substrate 3, and are formed on the bottom surfaces of the respective device electrodes 12A and 12B integrally with the respective device electrodes 12A and 12B. The auxiliary electrodes 13A and 13B are each formed in the shape of a rectangular parallelepiped whose exterior size is the same as that of the device electrode 12A or 12B, respectively, except that a groove portion 14 is formed, as shown in FIGS. 1B and 1C. The thickness of the auxiliary electrodes 13A and 13B, measured in the perpendicular direction, is larger than that of the device electrodes 12A and 12B, but the width and depth measured in the horizontal directions are the same as those of the device electrodes 12A and 12B. The horizontal dimensions of the auxiliary electrodes 13A and 13B may be made smaller than those of the device electrodes 12A and 12B or may be made larger. However, if the size of the auxiliary electrodes 13A and 13B were made too large, high density packaging could not be achieved; therefore, it is preferable that the size is chosen so that both the auxiliary electrodes 13A and 13B are hidden behind the semiconductor layer 11 when the LED device 1 is viewed from the top surface 111 side thereof.

The auxiliary electrodes 13A and 13B may be formed integrally with the device electrodes 12A and 12B from the beginning, or may be formed by bonding metal pieces in integral fashion to the device electrodes 12A and 12B. When forming them integrally from the beginning, first the device electrodes are, for example, formed thicker than the usual LED device, and then the device electrodes are etched to form the auxiliary electrodes 13A and 13B integrally with the device electrodes 12A and 12B. On the other hand, when bonding metal pieces, first a solder having a higher melting point than the solder 33 used for mounting the LED device 1, for example, is applied by printing over the bottom surfaces of the device electrodes 12A and 12B formed in advance, and then the metal pieces as the auxiliary electrodes 13A and 13B are bonded thereon.

The groove portions 14 are formed in the bottom surfaces of the auxiliary electrodes 13A and 13B, respectively. As shown in FIGS. 1C and 1D, the groove portions 14 are trapezoidal in vertical cross section. The side faces 141 and 142 of each groove portion 14 are slanted with respect to the bottom surface 113 of the semiconductor layer 11; more specifically, each side face is slanted toward the horizontal center of the auxiliary electrode 13A, 13B (i.e., inwardly) as the distance to the semiconductor layer 11 decreases. That is, the groove portion 14 is widest at the lower end of the auxiliary electrode 13A, 13B, which is the end opposite from the semiconductor layer 11, and becomes narrower in width toward the upper end which is the end nearer to the semiconductor layer 11. The cross-sectional shape of the groove portion 14 is not limited to a trapezoidal shape, and the groove portion 14 may be formed in any other suitable shape such as a triangular shape or a semi-circular shape, the only requirement being that the side faces be slanted inwardly as the distance to the semiconductor layer 11 decreases. However, since the groove portion 14 is even smaller than the LED device 1, it is desirable from a manufacturing point of view that the cross-sectional shape be made as simple as possible.

As shown in FIGS. 1B and 1C, each groove portion 14 extends through the auxiliary electrode 13A, 13B along the longitudinal direction thereof, and are open at both ends to the outside. That is, in the auxiliary electrode 13A having a plurality of side faces 131 to 134, the groove portion 14 is formed passing through the side faces 133 and 134 neither of which faces the other auxiliary electrode 13B. If the structural strength of the auxiliary electrode 13A, 13B can be maintained, the groove portion 14 may be formed to open in three directions by passing through one more side face 132. However, it is preferable that the side face 131 is closed because, if the groove portion 14 is formed passing through the side face 131 at which the auxiliary electrodes 13A and 13B face each other, the solder may flow into the space between the auxiliary electrodes 13A and 13B and may result in a short circuit.

Figure 3A:
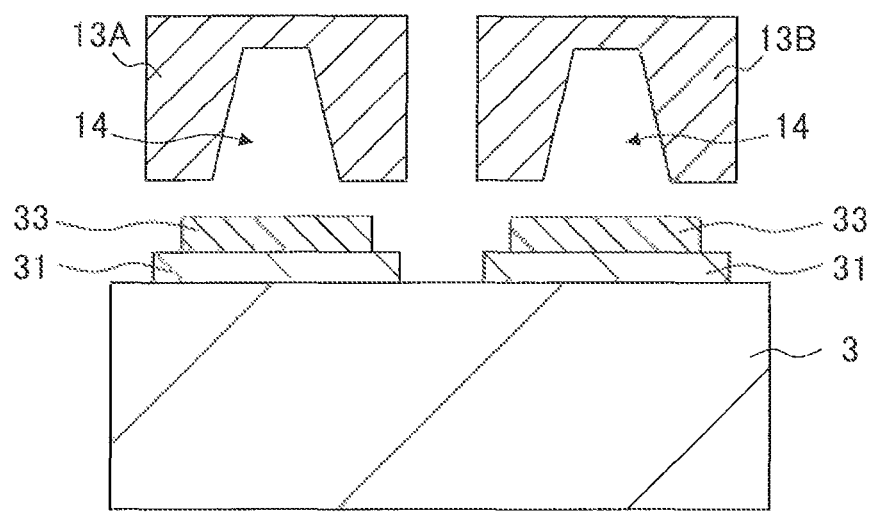
FIGS. 3A to 3C are cross-sectional views for explaining a mounting process for the LED device 1.
Figure 3B:
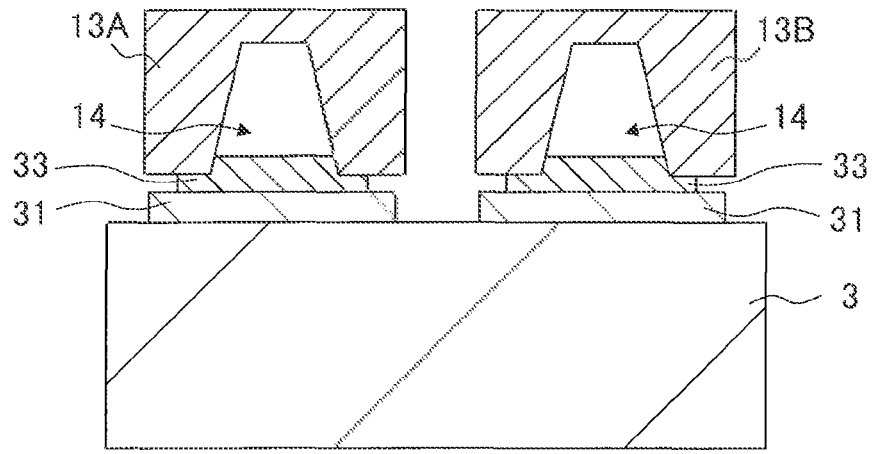
Figure 3C:
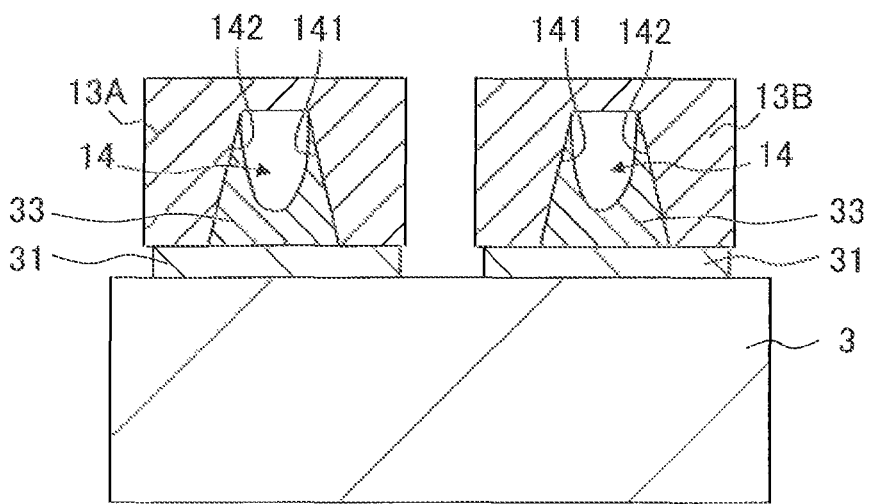
Figure 9A:
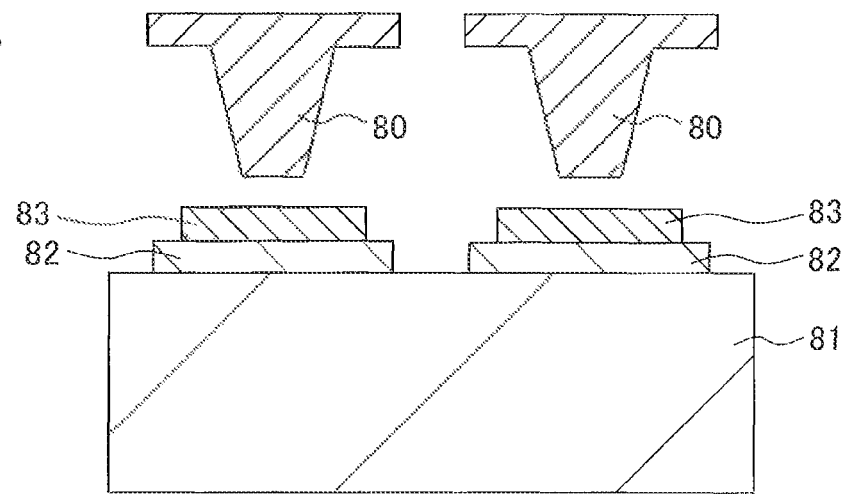
Figure 9B:
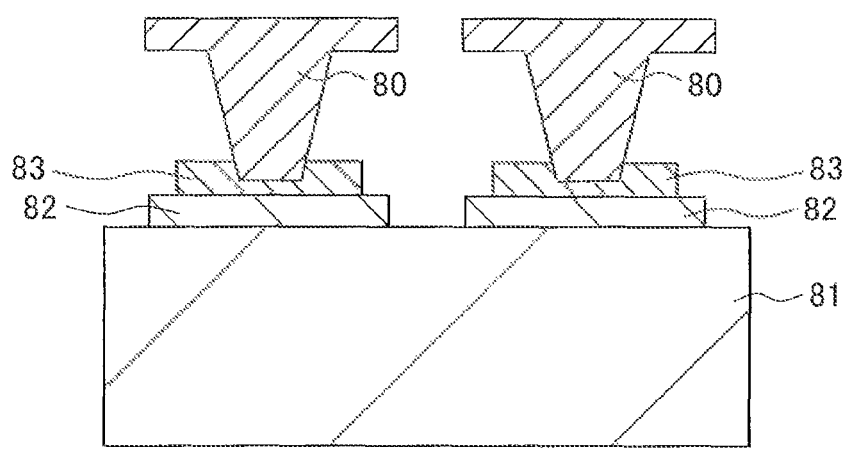
Figure 9C:
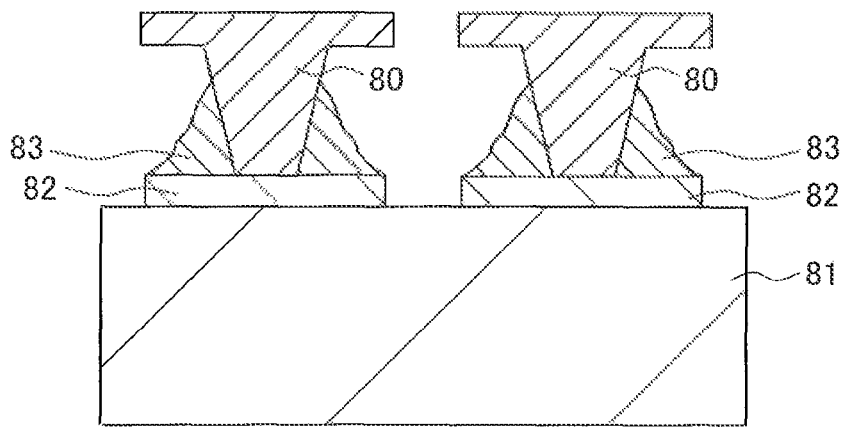

FIGS. 3A to 3C are cross-sectional views for explaining a mounting process for the LED device 1. The auxiliary electrodes 13A and 13B of the LED device 1, the substrate 3 on which the LED device 1 is mounted, the electrically conductive patterns 31 formed on the substrate 3, and the solder 33 for bonding are shown here. FIGS. 3A to 3C correspond to FIGS. 9A to 9C, respectively, and show the condition before mounting the LED device 1, the condition after mounting, and the condition after solder reflow, respectively.

When the LED device 1 is mounted on the substrate 3, the lower ends of the auxiliary electrodes 13A and 13B shown in FIG. 3A contact the solder 33 applied on the electrically conductive patterns 31 formed on the substrate 3, as shown in FIG. 3B. When solder reflow is performed with the solder 33 applied over an area just sufficient to be covered by the auxiliary electrodes 13A and 13B, the solder 33 melts and is accommodated in the form of solder balls inside each groove portion 14, and the solder 33 spreads up the side faces 141 and 142 of the groove portion 14, as shown in FIG. 3C. In particular, since the side faces 141 and 142 of the groove portion 14 are slanted inwardly as the distance to the upper end decreases, the solder 33 is easy to spread up. As a result, the solder 33 does not easily spread out the auxiliary electrodes 13A and 13B, and thus the chance of the solder 33 causing a short circuit between the adjacent electrodes can be reduced. Further, since the groove portion 14 is open at both ends to the outside, the flux gas generated during reflow does not remain trapped in the groove portion 14.

Furthermore, in the LED device 1, the effect of automatically correcting mounting displacements by self alignment can be expected. In the case of a device, such as a two-terminal device, that is small in size and limited in the number of terminals, since the electrodes are particularly small compared with the size of the device body and are formed near the center on the bottom surface of the device, self alignment does not easily occur and it is difficult to correct positional displacement during mounting. On the other hand, in the LED device 1, since self alignment easily occurs during mounting because of the presence of the auxiliary electrodes 13A and 13B, even if the LED device 1 is mounted on the substrate 3 by being displaced from the correct position, the displacement is automatically corrected during reflow soldering, provided that the amount of displacement is within tolerance.

Figure 4A:
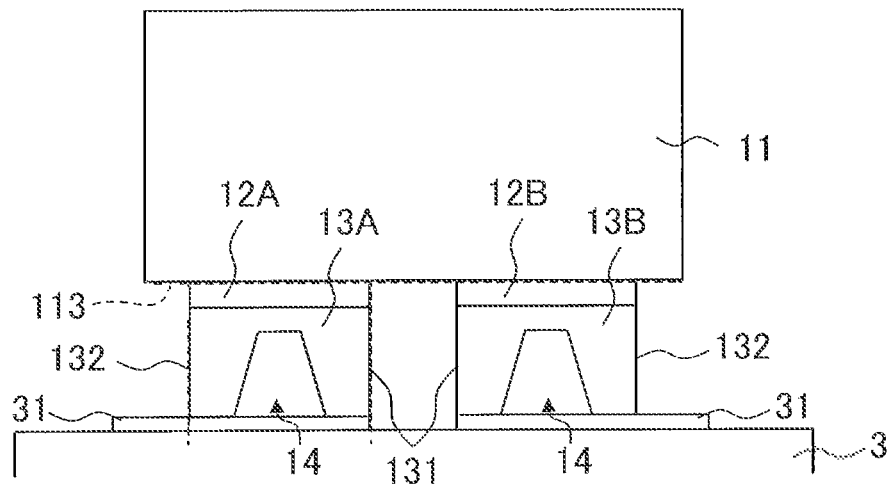
FIGS. 4A to 4C are side views for explaining modified examples of the auxiliary electrodes 13A and 13B.
Figure 4B:
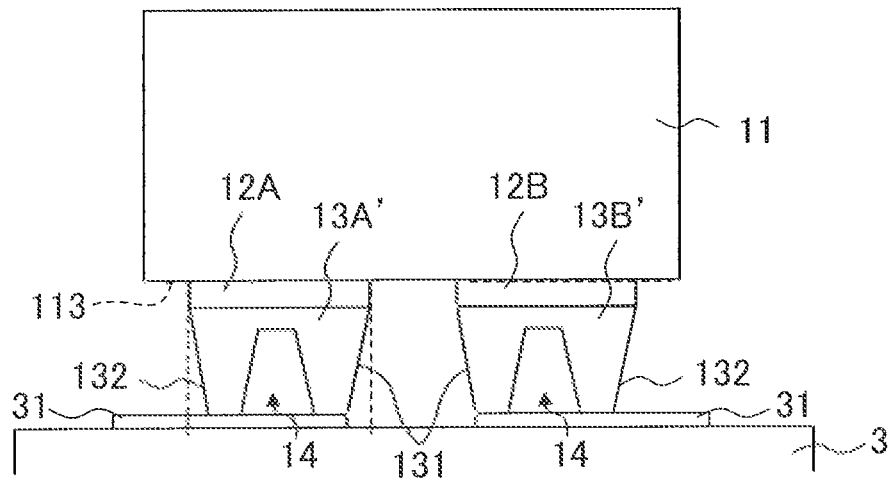
Figure 4C:
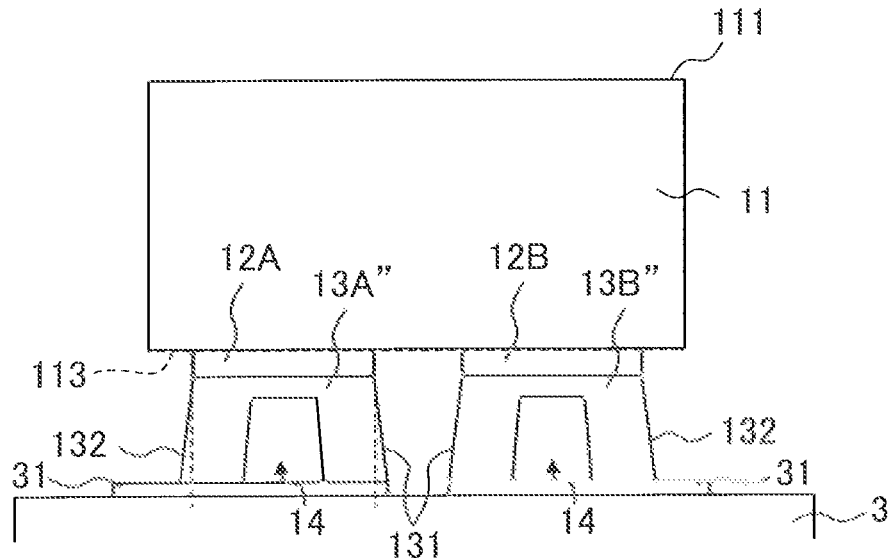

FIGS. 4A to 4C are side views for explaining modified examples of the auxiliary electrodes 13A and 13B. The LED device with the auxiliary electrodes and the electrically conductive patterns 31 formed on the substrate 3 to which the auxiliary electrodes are bonded are shown here.

FIG. 4A shows the auxiliary electrodes 13A and 13B that have been described with reference to FIGS. 1A to 1D. As shown in FIG. 4A, it is preferable that the side faces 131 and 132 of the auxiliary electrode 13A, 13B, i.e., the side faces other than the side faces where the groove portion 14 is formed passing through, are perpendicular to the bottom surface 113 of the semiconductor layer 11. In particular, when the spacing between the electrically conductive patterns 31 to which the respective auxiliary electrodes are bonded is substantially equal to the spacing between the device electrodes 12A and 12B, as shown in FIG. 4A, it is preferable that the opposing side faces 131 of the auxiliary electrodes 13A and 13B are perpendicular to the bottom surface 113.

FIG. 4B shows the auxiliary electrodes 13A' and 13B' in which the side faces 131 and 132 are slanted outwardly from the lower end toward the upper end, or more specifically, slanted so as to move away from the horizontal center of the auxiliary electrode as the distance to the semiconductor layer 11 decreases. As shown in FIG. 4B, when the spacing between the device electrodes 12A and 12B is smaller than the spacing between the electrically conductive patterns 31 to which the respective auxiliary electrodes are bonded, it is preferable that the side faces 131 and 132 are slanted outwardly from the lower end toward the upper end.

FIG. 4C shows the auxiliary electrodes 13A" and 13B" in which the side faces 131 and 132 are slanted inwardly from the lower end toward the upper end, or more specifically, slanted so as to move toward the horizontal center of the auxiliary electrode as the distance to the semiconductor layer 11 decreases. As shown in FIG. 4C, when the spacing between the device electrodes 12A and 12B is larger than the spacing between the electrically conductive patterns 31 to which the respective auxiliary electrodes are bonded, it is preferable that the side faces 131 and 132 are slanted inwardly from the lower end toward the upper end.

However, in the case of the auxiliary electrodes 13A' and 13B' shown in FIG. 4B, if the solder spreads out the groove portion 14 during reflow, the solder may contact between the adjacent auxiliary electrodes, resulting in a short circuit, since the solder spreads up the side faces 131 and 132 while also spreading horizontally. On the other hand, in the case of the auxiliary electrodes 13A" and 13B" shown in FIG. 4C, even if the solder spreads out the groove portion 14 during reflow, since the solder spreads up the side faces 131 and 132 toward the horizontal center of the auxiliary electrode, the solder is kept from spreading horizontally. As a result, the slanted side faces 131 and 132 shown in FIG. 4C are preferable to those shown in FIG. 4B. However, in the case of the auxiliary electrodes 13A" and 13B" also, it is preferable that the size is chosen so that both the auxiliary electrodes are hidden behind the semiconductor layer 11 when the LED device 1 is viewed from the top surface 111 side thereof. Furthermore, if the lower ends of the opposing side faces 131 of the auxiliary electrodes 13A" and 13B" are too close to each other because of the slanting of the side faces 131, a short circuit may occur between the auxiliary electrodes. Accordingly, of the side faces 131 and 132, preferably the side face 131 is made as perpendicular as possible.

Further, one of the two side faces 131 and 132 of each auxiliary electrode may not be slanted with respect to the vertical direction, or the two side faces may be slanted at different angles. For example, the opposing side faces 131 of the two auxiliary electrodes may be perpendicular as shown in FIG. 4A, and the opposite side faces 132 may be slanted as shown in FIG. 4B or 4C. Conversely, the opposing side faces 131 of the two auxiliary electrodes may be slanted as shown in FIG. 4B or 4C, and the opposite side faces 132 may be perpendicular as shown in FIG. 4A.

Figure 5A:
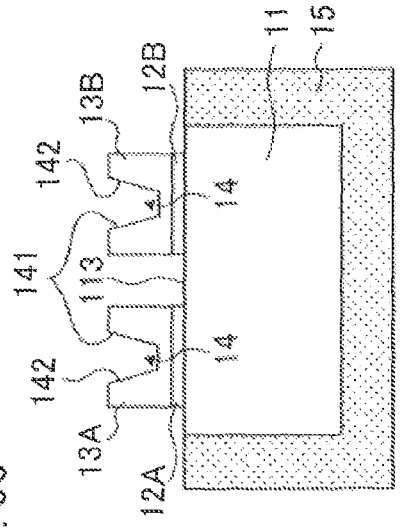
FIGS. 5A to 5D are diagrams showing the shape of an LED package 1' covered with a phosphor layer 15.
Figure 5C:
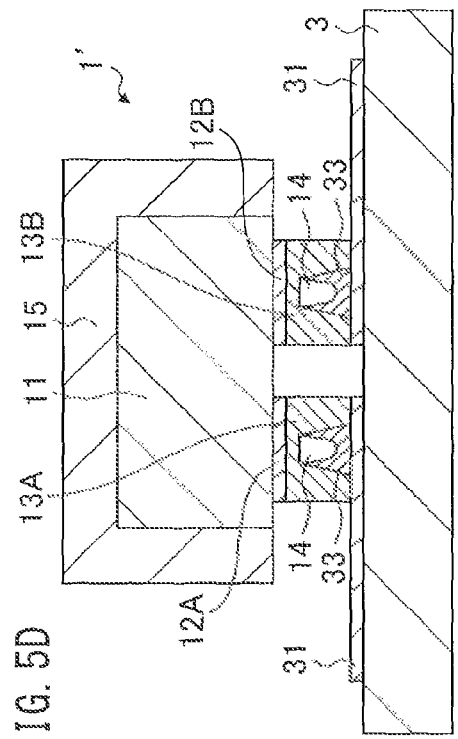
Figure 5B:
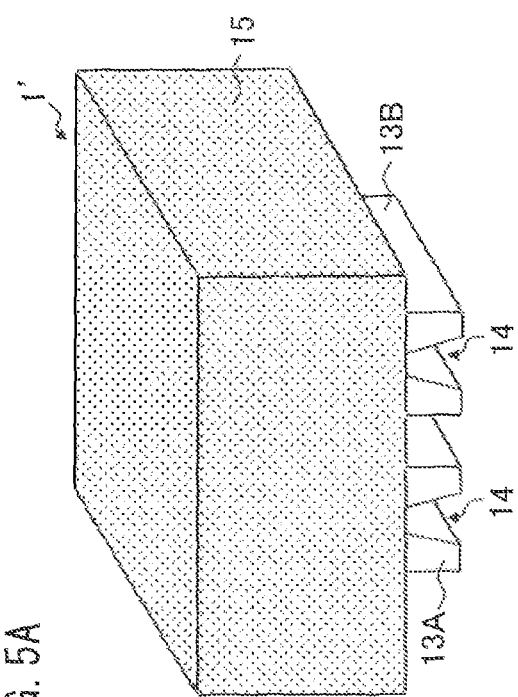
Figure 5D:
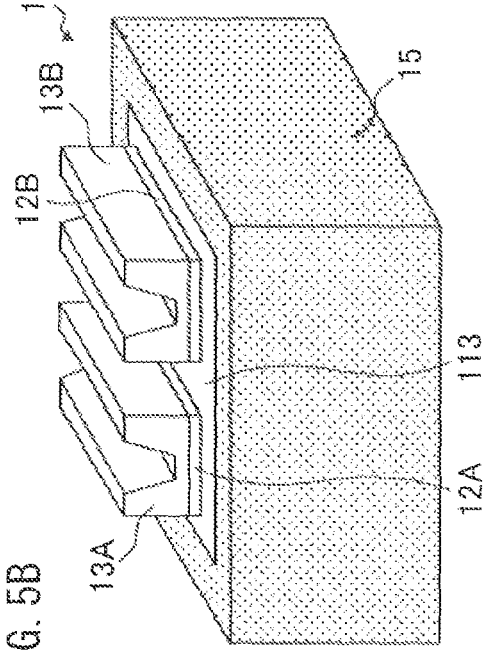
Figure 6:
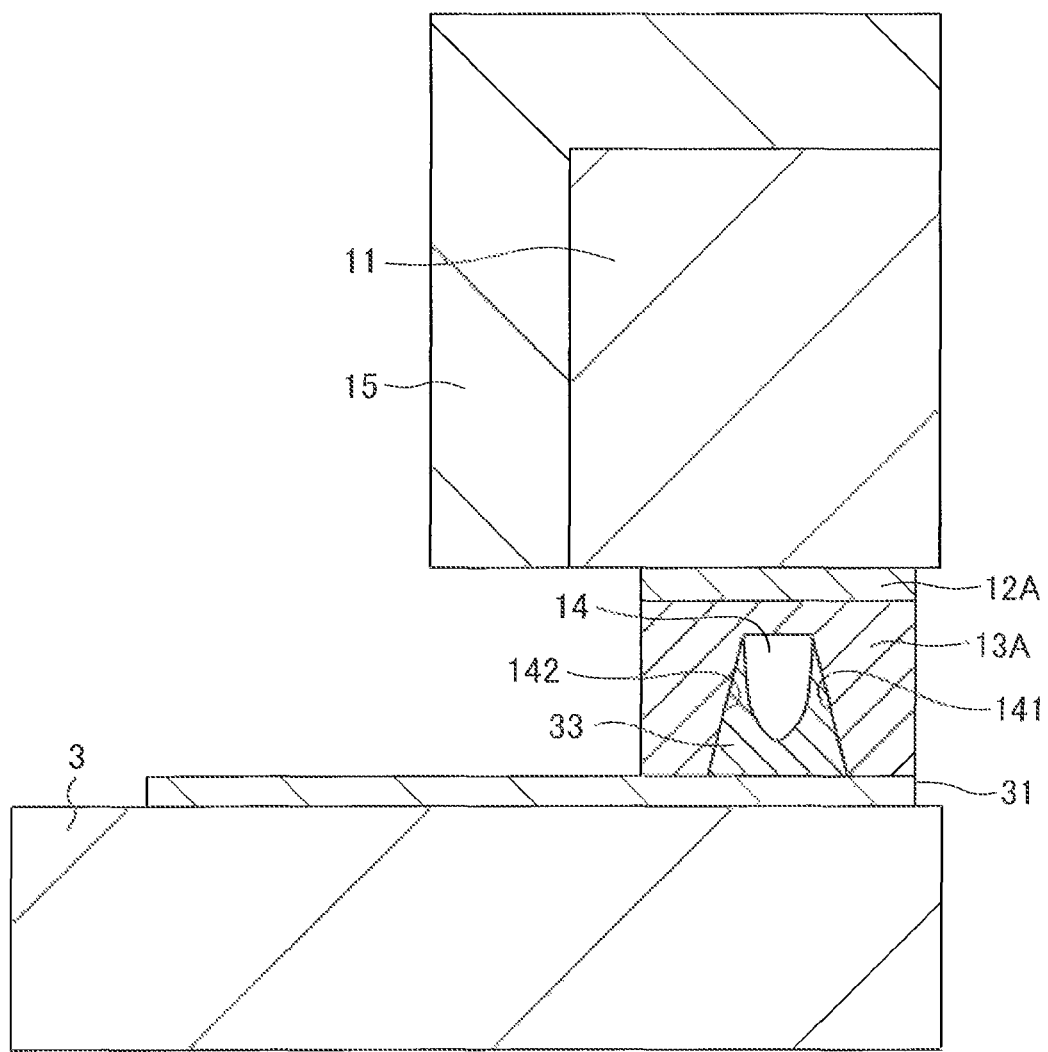
FIG. 6 is an enlarged view showing a portion of FIG. 5D.

FIGS. 5A to 5D are diagrams showing the shape of an LED package 1' covered with a phosphor layer 15. FIGS. 5 to 5D correspond to FIGS. 1A to 1D, respectively, and are, respectively, a perspective view of the LED package 1', a perspective view of the LED package 1' turned upside down from that shown in FIG. 5A, a side view of the LED package 1' turned upside down as in FIG. 5B, and a cross-sectional view of the LED package 1' bonded to the substrate 3 via solder 33. FIG. 6 is an enlarged view showing a portion of FIG. 5D.

The LED package 1' is constructed by covering the top surface 111 and four side faces 112 of the semiconductor layer 11 of the LED device 1 shown in FIGS. 1A to 1D with the phosphor layer 15. The phosphor layer 15 is formed, for example, by dispersing and mixing phosphor particles through a colorless transparent resin such as an epoxy resin or silicone resin. The phosphor layer 15 covers the semiconductor layer 11 of the LED device 1 everywhere except the bottom surface 113 thereof. Each side edge of the bottom surface 113 of the semiconductor layer 11 is covered with an edge of the phosphor layer 15, and the bottom surface 113 and the device electrodes 12A and 12B are exposed in the center of the bottom surface 113. Preferably, the phosphor layer 15 contains the phosphor particles uniformly, and covers the surfaces of the LED device 1, except the bottom surface 113, with a uniform thickness.

For example, the phosphor layer 15 contains a yellow phosphor. The yellow phosphor is, for example, a particulate phosphor material, such as YAG (yttrium aluminum garnet), that absorbs the blue light emitted from the LED device 1 and wavelength-converts it into yellow light. The LED package 1' produces white light by combining the blue light emitted from the blue LED device 1 with the yellow light generated by exciting the yellow phosphor with the emitted light.

The phosphor layer 15 may alternatively contain a plurality of kinds of phosphors, for example, a green phosphor and a red phosphor. The green phosphor is, for example, a particulate phosphor material, such as $(BaSr)_2SiO_4:Eu^{2+}$, that absorbs the blue light emitted from the LED device 1 and wavelength-converts it into green light. The red phosphor is, for example, a particulate phosphor material, such as $CaAlSiN_3:Eu^{2+}$, that absorbs the blue light emitted from the LED device 1 and wavelength-converts it into red light. In this case, the LED package 1' produces white light by combining the blue light emitted from the blue LED device 1 with the green light and red light generated by exciting the green phosphor and red phosphor with the emitted light.

In the LED package 1', the auxiliary electrodes 13A and 13B are disposed with their horizontal ends located inwardly of the outer peripheral surfaces of the phosphor layer 15 so that a plurality of such LED packages can be mounted close together at high density. More specifically, when the LED package 1' is viewed from the top, the auxiliary electrodes 13A and 13B are hidden from view by the phosphor layer 15 with the edges of the auxiliary electrodes 13A and 13B not running over the edges of the phosphor layer 15.

In the LED package 1', as in the LED device 1, the effect of suppressing the spreading of the solder during reflow and the effect of self alignment can be obtained due to the presence of the auxiliary electrodes 13A and 13B having the groove portions 14.

Figure 7:
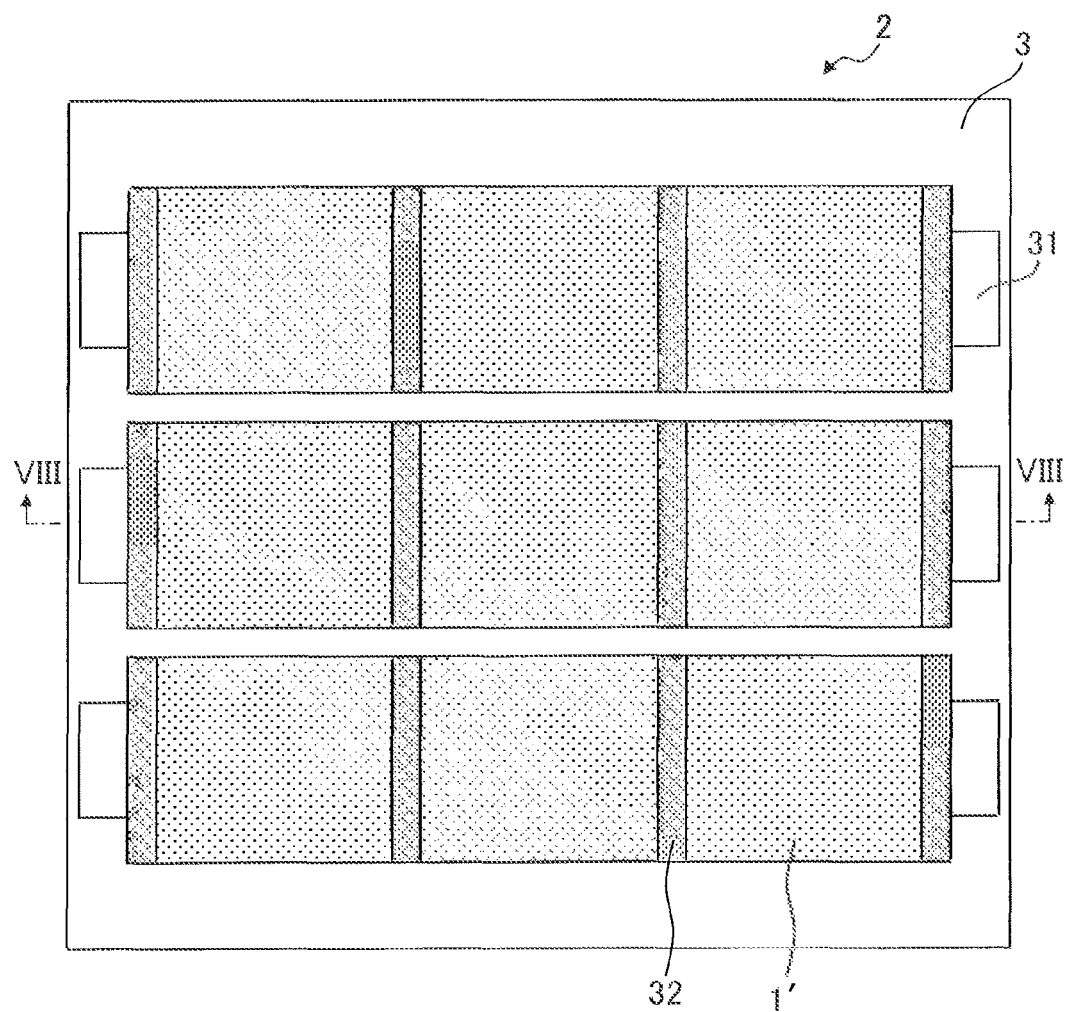
FIG. 7 is a top plan view of a light-emitting apparatus 2.
Figure 8:
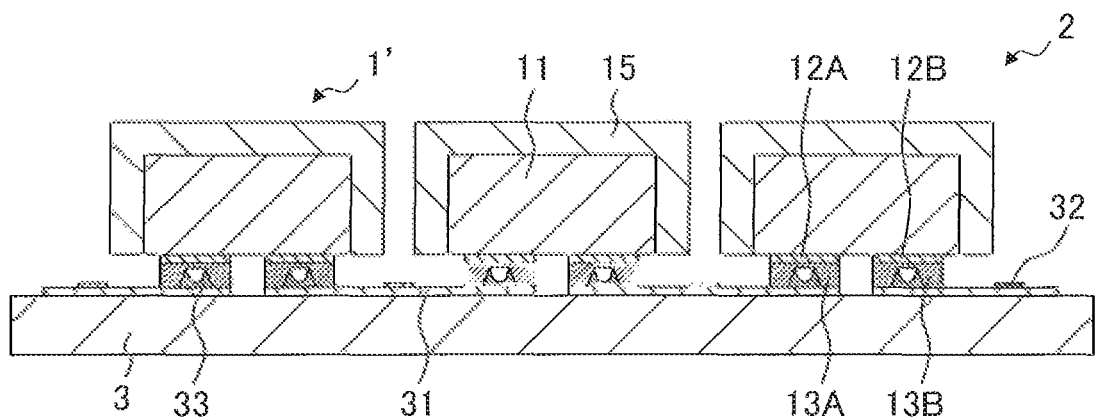
FIG. 8 is a cross-sectional view of the light-emitting apparatus 2 taken along line VIII-VIII in FIG. 7.

FIG. 7 is a top plan view of a light-emitting apparatus 2. FIG. 8 is a cross-sectional view of the light-emitting apparatus 2 taken along line VIII-VIII in FIG. 7. The light-emitting apparatus 2 corresponds, for example, to a light-emitting part used in various lighting equipment such as an illumination LED or an LED lamp, and comprises a plurality of LED packages 1' and a substrate 3 as major component elements. FIG. 7 shows an example in which nine LED packages 1' are arranged in a 3×3 array. In FIG. 8, three of the nine LED packages 1' contained in the light-emitting apparatus 2 and the substrate 3 are shown in cross section.

Each LED package 1' is one example of a semiconductor device (semiconductor light-emitting device), and is the same device as that shown in FIGS. 5A to 5D. Each LED package 1' includes the auxiliary electrodes 13A and 13B described with reference to FIGS. 1A to 1D, and the plurality of LED packages 1' are mounted close together (at small pitches) on the substrate 3 and bonded to the substrate 3 via solder 33 by reflow soldering.

The substrate 3 is, for example, an insulating substrate such as a glass epoxy substrate, a BT resin substrate, a ceramic substrate, or a metal core substrate. Electrically conductive patterns 31 to which the auxiliary electrodes 13A and 13B of the plurality of LED packages 1' are bonded are formed on the top surface of the substrate 3. A resist 32 is formed over the portions of the electrically conductive patterns 31 not covered with the LED packages 1', except the left edge and right edge of the substrate 3 in FIG. 7.

The electrically conductive patterns 31 are formed in three rows to correspond with the array of the LED packages 1' arranged three horizontally and three vertically in FIG. 7. As shown in FIG. 8, the electrically conductive pattern 31 in each row is formed with slits located underneath the respective LED packages 1', and is separated by each slit between a portion to which one of the auxiliary electrodes 13A and 13B is connected and a portion to which the other one is connected. The three LED packages 1' in each row are connected in series, and the left edge and right edge of the substrate 3 in FIG. 7 are connected to an external power supply so that when a voltage is applied thereacross, the light-emitting apparatus 2 emits light.

As previously described with reference to FIGS. 3A to 3C, the auxiliary electrodes 13A and 13B are each formed with the groove portion 14 whose side faces 141 and 142 are slanted inwardly as the distance to the upper end decreases, so that the solder 33 melted during reflow is accommodated inside the groove portion 14 and spreads up the side faces 141 and 142. As a result, the solder 33 does not easily spread out the auxiliary electrodes 13A and 13B, and thus the chance of the solder 33 causing a short circuit between the adjacent electrodes can be reduced.

Further, the presence of the auxiliary electrodes 13A and 13B has the effect of achieving self alignment when mounting the LED package 1' on the substrate 3. As a result, even if the LED package 1' is mounted on the substrate 3 by being somewhat displaced from the correct position, the displacement is automatically corrected.

Furthermore, since the auxiliary electrodes 13A and 13B are formed spreading horizontally but not running over the edges of the phosphor layer 15, the auxiliary electrodes 13A and 13B do not get in the way when mounting the plurality of LED packages 1' close together on the substrate 3. As a result, in the light-emitting apparatus 2, it also becomes possible to mount a plurality of bump-type LED packages 1' closely spaced apart from each other. Accordingly, in the light-emitting apparatus 2, the color mixing property due to the lights emitted from the plurality of LED packages 1' can be enhanced.

The preceding description has been presented only to illustrate and describe exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A semiconductor device which is bonded to a substrate by solder, comprising:
   a semiconductor layer;
   a plurality of device electrodes formed on a bottom surface of the semiconductor layer; and
   a plurality of auxiliary electrodes formed integrally with the plurality of device electrodes, respectively, wherein
   each of the auxiliary electrodes includes a groove portion formed in a bottom surface thereof,
   a side face of the groove portion is slanted with respect to the bottom surface of the semiconductor layer so that the groove portion becomes narrower in width with increasing distance from a lower end of the auxiliary electrode and decreasing distance to an upper end thereof,
   the bottom surface of each of the auxiliary electrodes other than the groove portion is a flat surface, and
   in each of the auxiliary electrodes having a plurality of side faces, the groove portion is formed passing through a side face of the auxiliary electrode that does not face any other auxiliary electrode.

2. The semiconductor device according to claim 1, wherein, in each of the auxiliary electrodes, a side face through which the groove portion is not formed is perpendicular to the bottom surface of the semiconductor layer.

3. The semiconductor device according to claim 1, wherein
   the semiconductor layer contains a light-emitting layer, and
   the semiconductor device further includes a phosphor layer which contains a phosphor and which covers a top surface and side surface of the semiconductor layer.

4. The semiconductor device according to claim 3, wherein horizontal end portions of the plurality of auxiliary electrodes are located inwardly of an outer peripheral surface of the phosphor layer.

5. The semiconductor device according to claim 1, wherein, at least one of outer side surfaces of each of the auxiliary electrodes extending along the groove portion is slanted with respect to the bottom surface of the semiconductor layer.

6. The semiconductor device according to claim 5, wherein
   the plurality of auxiliary electrodes are two auxiliary electrodes, and
   outer side surfaces of the two auxiliary electrodes facing each other are slanted so as to move away from each other as a distance to the semiconductor layer decreases.

7. The semiconductor device according to claim 6, wherein two outer side surfaces of each of the two auxiliary electrodes extending along the longitudinal direction are slanted so as to move toward the horizontal center of the auxiliary electrode as the distance to the semiconductor layer decreases.

8. A light-emitting apparatus comprising:
   a semiconductor light-emitting device; and
   a substrate formed with an electrically conductive pattern thereon to which the semiconductor light-emitting device is bonded by solder, wherein
   the semiconductor light-emitting device comprises:
   a semiconductor layer containing a light-emitting layer;
   a plurality of device electrodes formed on a bottom surface of the semiconductor layer; and
   a plurality of auxiliary electrodes formed integrally with the plurality of device electrodes, respectively, and wherein
   each of the auxiliary electrodes includes a groove portion formed in a bottom surface thereof,
   a side face of the groove portion is slanted with respect to the bottom surface of the semiconductor layer so that the groove portion becomes narrower in width with increasing distance from a lower end of the auxiliary electrode and decreasing distance to an upper end thereof,
   the bottom surface of each of the auxiliary electrodes other than the groove portion is a flat surface, and
   in each of the auxiliary electrodes having a plurality of side faces, the groove portion is formed passing through a side face of the auxiliary electrode that does not face any other auxiliary electrode.

* * * * *